United States Patent [19]

Job

[11] Patent Number: 5,281,171
[45] Date of Patent: Jan. 25, 1994

[54] FUSE HOLDING DEVICE

[75] Inventor: Elmer G. Job, Fort Wayne, Ind.

[73] Assignee: Carrier Corporation, Syracuse, N.Y.

[21] Appl. No.: 992,346

[22] Filed: Dec. 17, 1992

[51] Int. Cl.⁵ .................................. H01R 13/00
[52] U.S. Cl. ........................................ 439/621
[58] Field of Search ......................... 449/620-622, 449/698, 55, 76, 571, 572

[56] References Cited

U.S. PATENT DOCUMENTS 3,444,502  5/1969  Matthews ........................ 439/621
4,221,455  9/1980  Cairns et al. .................... 439/621

OTHER PUBLICATIONS

Keystone Electronics Corporation, "New Product Bulletin", Publication Date Unknown.
Keystone Electronics Corporation, Catalog No. 888, Publication Date Unknown (Copyright 1985), pp. 22 and 23.

*Primary Examiner*—Joseph H. McGlynn

[57] ABSTRACT

A fuse holding device for securely holding a removable fuse in place at a height above a printed circuit board so as to allow the fuse to be easily grasped and replaced without interfering with surrounding electrical components.

10 Claims, 2 Drawing Sheets 5,281,171

FUSE HOLDING DEVICE

BACKGROUND OF THE INVENTION

This invention relates generally to the holding and fastening of electrical components to a printed circuit board. In particular, this invention relates to method and apparatus for mounting a fuse on to a printed circuit board.

Various socket devices have been heretofore used to hold electrical fuses that need to be removed and replaced from time to time on a printed circuit board. The amount of space which these sockets can occupy on the printed circuit board has increasingly become more and more limited. This has led to the development of small socket or holding devices that do not occupy much space on the circuit board. These small holding devices located on crowded printed circuit boards do not however allow the fuse to be easily grasped when the component is to be removed and replaced. These small holding devices may also not provide much structure for securely holding the fuse in place. These small holding devices furthermore have very limited structure for mounting the holding device to the crowded printed circuit board. This mounting structure must not only secure the holding device to the printed circuit board but also must withstand the forces normally associated with removing and replacing the fuse.

SUMMARY OF THE INVENTION

It is an object of the present invention to provide a fuse holding device which allows a miniaturized fuse to be easily removed or replaced without interference or contact with adjacent components mounted on a printed circuit board.

It is another object of the invention to provide a fuse holding device that occupies minimal space on a printed circuit board while at the same time providing sufficient structure to facilitate easy removal and replacement of an electrical fuse.

The above and other objects are achieved according to the present invention by providing a structurally rigid fuse holding device that snaps into place on a printed circuit board and immediately makes electrical contact with the circuitry on the board. Tabs on the fuse holding device maintain the thus mounted device on the board until such time as electrical contact is further secured by a soldering process.

The fuse holding device is relatively high in relation to the foot print dimensions which it makes on the printed circuit board. The fuse holding device moreover contains lengthy electrical contacts which extend downwardly through the fuse holding device so as to allow the fuse leads to make electrical contact with the board circuitry at an appreciable height above the circuit board.

BRIEF DESCRIPTION OF THE DRAWINGS

Other objects and advantages of the present invention will be apparent from the following description in conjunction with the accompanying drawings in which.

DESCRIPTION OF THE PREFERRED EMBODIMENT

Figure 1:
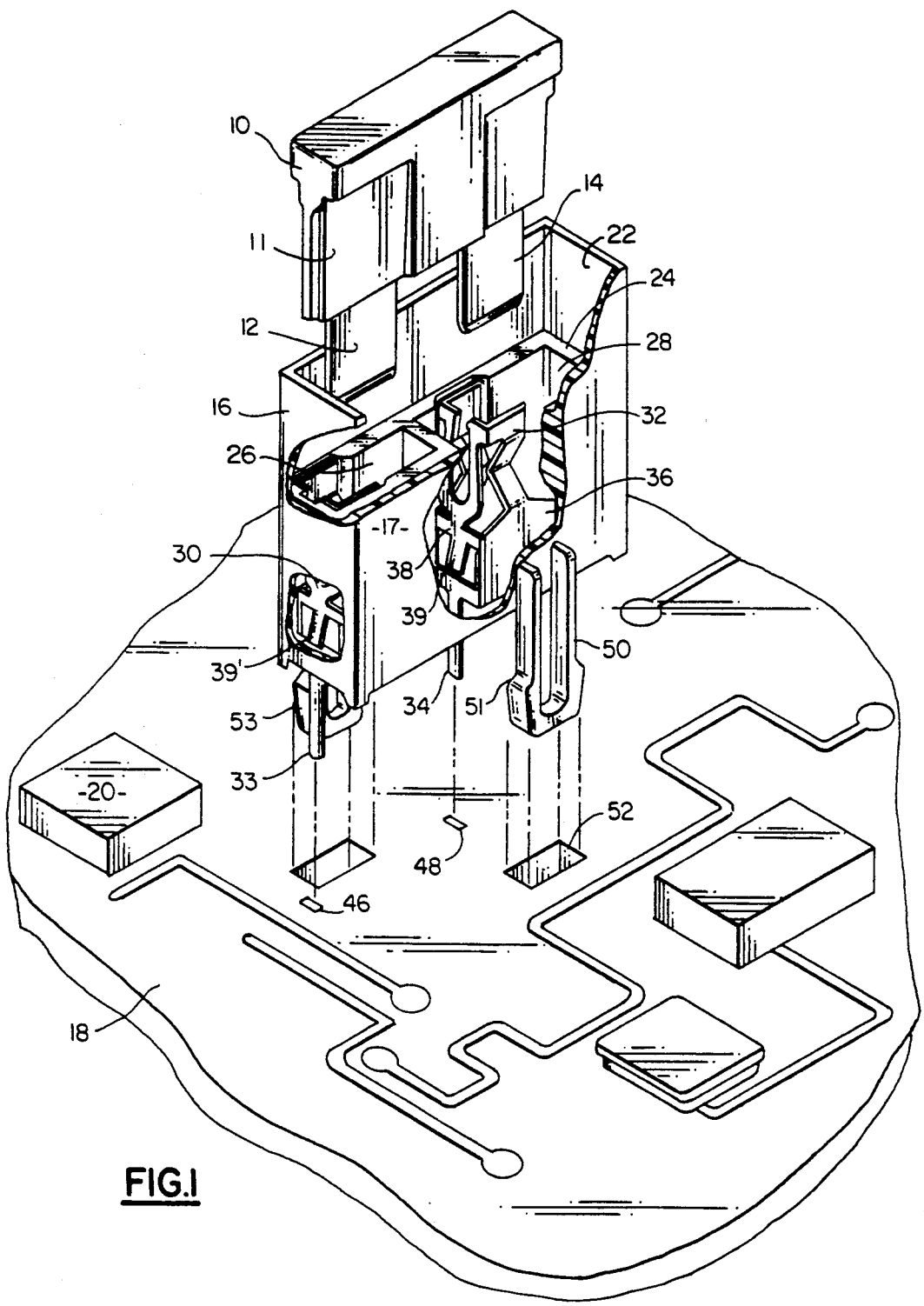
FIG. 1 is a perspective view of the fuse holding device illustrated relative to a fuse and a printed circuit board.

Referring to FIG. 1, an electrical fuse 10 with fuse body 11 and blade type electrical leads 12 and 14 extending downwardly therefrom is seen to be positioned above a fuse holding device 16. The fuse holding device 16 is in turn positioned above a printed circuit board 18 having various electrical components such as 20 mounted thereon. It is to be appreciated that the electrical components will be mounted on the board in such a manner as to allow little space for the fuse holding device 16.

The fuse holding device 16 is seen to include a molded housing 17 having thin walls such as 22 rising upwardly from an interior surface 24. The molded housing 17 is preferably molded from a Dupont 6/6 nylon or equivalent hard plastic material. The thin walls 22 preferably rise above the interior surface 24 for a distance of three tenths of an inch or at least one-half the height of the fuse body 11. The interior surface 24 itself is preferably one-half inch above the bottom edge of the housing 17 that will make contact with the printed circuit board 18.

The interior surface 24 includes recesses 26 and 28 extending downwardly therefrom so as to receive the blade-like electrical contacts 12 and 14 from the fuse 10. The recesses 26 and 28 each have an electrically conductive member 30 or 32 fitted therein. Each electrically conductive member will make electrical contact with a fuse lead in a manner which will be described hereinafter. Each electrically conductive member includes a bottom lead portion 33 or 34 which extends downwardly from the bottom of the housing 17.

Figure 2:
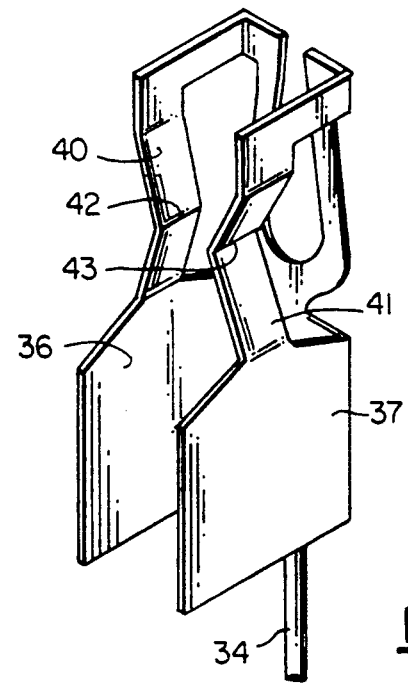
FIG. 2 is a perspective view of an electrical contact member within the fuse holding device which establishes electrical contact between the fuse and the circuitry on the printed circuit board.

Referring to the electrically conductive member 32 in FIG. 1, it is seen that the bottom lead portion 34 is T-shaped and is connected to a side 36 that normally abuts an interior wall of the recess 28. Referring to FIG. 2, the electrically conductive member is seen to include a second side 37 that is parallel to the side 36. Referring again to FIG. 1, the sides 36 and 37 are furthermore connected above the T-shaped bottom lead portion 34 by a cross member 38 having an outwardly bent tab 39. The outwardly bent tab 39 engages a lip (not shown) formed within the recess 28 so as to allow the member 30 to be initially inserted into the bottom of the recess but which resists any attempt to thereafter remove the member 30. This tab engagement within a recess is shown for the bent tab 39' within the recess 26. Referring to the parallel sides 36 and 37 in FIG. 2, it is seen that each side includes an inwardly bent member 40 or 41. Central bends 42 and 43 in each inwardly bent member extend toward each other so as to define the electrical contacts that engage the blade-like contacts 12 and 13 of the fuse 10. It is to be appreciated that the flexible construction of each inwardly bent member 40 or 41 allows the bends 42 or 43 to flex and move apart when the blade of a fuse is inserted therein. This in turn moves the parallel sides 36 and 37 firmly against the interior walls of the recess 26 so as to firmly hold the inserted lead within the fuse holding device.

Referring again to FIG. 1, the bottom lead portions 33 and 34 of electrically conductive members 30 and 32 are seen to extend downwardly below the bottom of the molded housing for the fuse holder 16. The bottom lead portions 33 and 34 of electrically conductive members 30 and 32 preferably extend below the bottom edge of the housing for a distance substantially greater than the thickness of the printed circuit board 10. This will allow bottom lead portions 33 and 34 when inserted into a pair of spaced holes 46 and 48 to extend beyond the bottom surface of the printed circuit board 10 when the fuse holder 16 is mounted on the board. This will allow the bottom lead portion 33 and 34 to make electrical contact with whatever electrical circuitry there may be on the printed circuit board 10. This electrical contact is preferably secured eventually by a wave flow soldering process.

Referring again to the fuse holding device 16, the molded housing 17 is seen to include a downwardly extending, molded leg 50 which inserts into a slotted hole 52 in the printed circuit board. The molded leg 50 is U-shaped with slight shelf-like extensions such as 51 at the bottom of its U-shape so as to hold the molded leg in place once inserted into the slotted hole 52. It is to be appreciated that a similar molded leg 53 appears on the opposite side of the fuse holding device 16. This second molded leg 53 is spaced the same distance from the diagonally opposite edge of the holding device as is the leg 50 from its nearest edge. The leg spacing allows the holding device to be rotated one hundred eighty degrees and still register with the respective slotted holes such as 52 in the printed circuit board 18. It is to be appreciated that the U-shaped molded legs will snap into place in their respective slotted holes and secure the fuse holding device 16 to the printed circuit board 18. The U-shaped molded legs 50 and 53 together with the ultimately soldered bottom lead portions 33 and 34 of the electrically conductive members 30 and 32 sufficiently anchor the fuse holding device so as to withstand any forces associated with inserting or removing the fuse 10.

Figure 3:
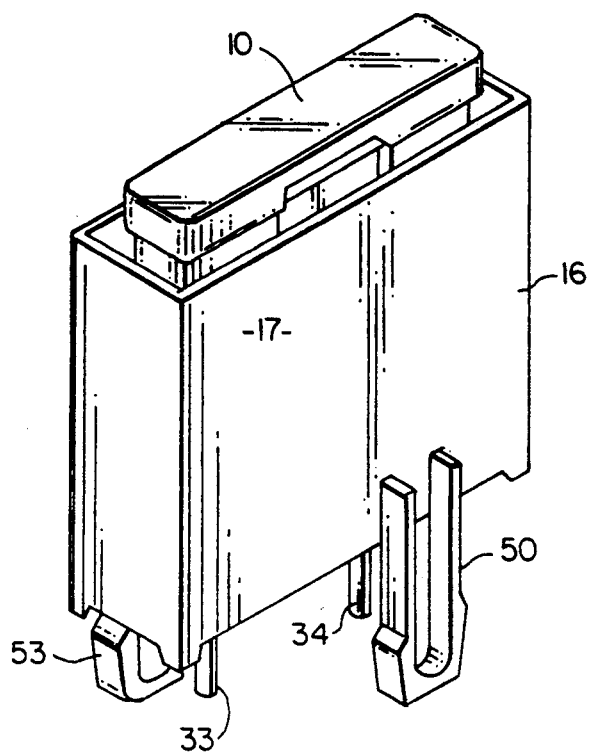
FIG. 3 is a perspective view of the fuse holding device with a fuse fully inserted therein.

Referring to FIG. 3, the fuse 10 is illustrated as being fully inserted into the fuse holding device 16 that has not itself been mounted to a circuit board. It is to be appreciated that the fuse body is substantially inside the fuse holding device as a result of where the bottom of the fuse body engages the interior surface within the fuse body 16.

While the invention has been described with respect to a preferred embodiment, it will be appreciated that many modifications and changes may be made by those skilled in the art without departing from the scope of the invention. It is therefore intended that the scope of the present invention be limited only by the scope of the following claims.

What is claimed is:

1. A fuse holding device to be mounted to a printed circuit board comprising:
  a molded housing for receiving a fuse to be held therein;
  an interior surface within said molded housing, said interior surface positioned at a height above the bottom of said housing so as to define the limit to which a fuse body can be inserted into said housing;
  a pair of recesses within said molded housing, each recess extending downwardly from said interior surface so as to receive a lead from a fuse; and
  a pair of electrical contact members, each flexibly mounted with in a respective recess so as to make electrical contact with an inserted fuse lead.

2. The fuse holding device of claim 1 wherein the height of said interior surface above the bottom of said housing is equal to or greater than one-half inch.

3. The fuse holding device of claim 1 wherein said molded housing is molded from a nylon plastic.

4. The fuse holding device of claim 1 wherein said molded housing further comprises:
  a pair of integrally molded, legs extending downwardly from the bottom surface of said molded housing, said integrally molded legs positioned on opposite sides of the fuse holding device and spaced from opposing ends of the fuse holding device.

5. The fuse holding device of claim 4 wherein said pair of molded, downwardly extending legs are U-shaped so as to be flex when inserted into the spaced holes within a printed circuit board.

6. The fuse holding device of claim 4 wherein said pair of contact members extend downwardly below the bottom of said molded housing for a distance substantially greater than the thickness of a printed circuit board in which the fuse holder may be mounted so as to allow for soldering of the elongated electrical contact members to the circuitry on the printed circuit board.

7. The fuse holding device of claim 1 wherein said molded plastic housing includes thin walls extending above said interior surface for a distance sufficient to surround a substantial portion of the housing for a fuse inserted into said fuse holding device.

8. The fuse holding device of claim 7 wherein the thin walls extend above said interior surface for a distance equal to at least one-half of the fuse body.

9. The fuse holding device of claim 1 wherein each of said pair of electrical contact members comprise:
  a member extending downwardly below the bottom of said molded housing;
  an upper portion integrally connected to the downwardly extending member and comprising:
    a pair of inwardly bent members which define the electrical contacts that are to be made with a lead from the fuse; and
    a pair of sides connected to the inwardly bent members and furthermore connected to said member extending downwardly below the bottom of said molded housing, said pair of sides flexing outwardly toward the interior walls of a recess when said inwardly bent members contact a lead from a fuse being inserted.

10. The fuse holding device of claim 9 wherein said upper portion of an electrical contact member further comprises:
  an outwardly extending bent member which engages the recess of the molded housing when the elongated electrical contact member is inserted into said housing and resists any attempt to thereafter remove the elongated electrical contact member from the recess.

* * * * *